United States Patent
Lee

(10) Patent No.: US 7,600,065 B2
(45) Date of Patent: Oct. 6, 2009

(54) ARBITRATION SCHEME FOR SHARED MEMORY DEVICE

(75) Inventor: Young-Min Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 135 days.

(21) Appl. No.: 11/480,704

(22) Filed: Jul. 3, 2006

(65) Prior Publication Data

US 2007/0079038 A1    Apr. 5, 2007

(30) Foreign Application Priority Data

Oct. 5, 2005    (KR) .................. 10-2005-0093308

(51) Int. Cl.
*G06F 12/00*    (2006.01)
*G06F 13/28*    (2006.01)
*H03M 13/00*    (2006.01)

(52) U.S. Cl. .................. 710/240; 711/105; 711/106; 711/147; 714/754

(58) Field of Classification Search ......... 710/240–244; 711/105–106

See application file for complete search history.

(56) References Cited

U.S. PATENT DOCUMENTS

| | | | | |
|---|---|---|---|---|
| 4,924,381 A * | 5/1990 | Tokuume | .................. | 711/106 |
| 5,784,582 A * | 7/1998 | Hughes | .................. | 710/117 |
| 5,845,097 A | 12/1998 | Kang et al. | .................. | 395/297 |
| 6,219,747 B1 * | 4/2001 | Banks et al. | .................. | 711/105 |
| 6,285,616 B1 * | 9/2001 | Ikabata | .................. | 365/222 |
| 6,385,692 B2 * | 5/2002 | Banks et al. | .................. | 711/105 |
| 6,393,505 B1 * | 5/2002 | Scalise et al. | .................. | 710/107 |
| 6,721,225 B2 * | 4/2004 | Tsukude | .................. | 365/222 |
| 6,754,786 B2 * | 6/2004 | Suzuki et al. | .................. | 711/150 |
| 6,848,035 B2 * | 1/2005 | Akiyama et al. | .................. | 711/156 |
| 6,934,820 B2 * | 8/2005 | Chauvel et al. | .................. | 711/157 |
| 7,093,047 B2 * | 8/2006 | Au et al. | .................. | 710/243 |
| 7,145,828 B2 * | 12/2006 | Lee et al. | .................. | 365/222 |
| 7,254,688 B2 * | 8/2007 | Uneme | .................. | 711/167 |
| 7,366,828 B2 * | 4/2008 | Sakurai | .................. | 711/106 |
| 7,454,586 B2 * | 11/2008 | Shi et al. | .................. | 711/167 |
| 2002/0010823 A1 | 1/2002 | Wenzel | | |
| 2006/0143372 A1 * | 6/2006 | Walker et al. | .................. | 711/106 |
| 2006/0239095 A1 * | 10/2006 | Shi et al. | .................. | 365/222 |
| 2007/0070794 A1 * | 3/2007 | Lee et al. | .................. | 365/233 |

OTHER PUBLICATIONS

Maxwell Technologies, "Introduction to Synchronous DRAM". Apr. 25, 2003, 15 pages.*
Micron, "Synchronous DRAM". Retrieved from the website, "http://download.micron.com/pdf/datasheets/dram/sdram/512MbSDRAM.pdf" on Aug. 18, 2008. 68 pages.*
Korean Patent Application No. 1019950067423 to Sim, having Publication date of Feb. 28, 2002 (w/English Abstract page).

(Continued)

*Primary Examiner*—Mark Rinehart
*Assistant Examiner*—Brian T Misiura
(74) *Attorney, Agent, or Firm*—Monica H. Choi

(57) ABSTRACT

For arbitrating access to a shared memory device among a plurality of masters, a master generates a request for access signal that is sent to the arbitrator concurrently with an indispensable command such as an auto-refresh command that is generated in series. The arbitrator generates an acknowledge signal sent to the master for indicating approval or rejection for access. Existing pins of the master are used for transmission of such arbitration signals.

26 Claims, 8 Drawing Sheets

OTHER PUBLICATIONS

Korean Patent Application No. 1019960047658 to Cho, having Publication date of Feb. 18, 1999 (w/English Abstract page).

Japanese Patent Application No. 2002-235579 to Shigeki, having Publication date of Mar. 11, 2004 (w/English Abstract page).

* cited by examiner

ARBITRATION SCHEME FOR SHARED MEMORY DEVICE

CROSS-REFERENCE TO RELATED APPLICATION(S)

The present application claims priority under 35 U.S.C. §119 to Korean Patent Application No. 2005-93308, filed on Oct. 5, 2005, which is incorporated herein by reference in its entirety.

TECHNICAL FIELD

The present invention relates generally to arbitration for a shared memory device, and more particularly, to using a series of an indispensable command such as an auto-refresh command by a plurality of masters when requesting access to the shared memory device such as a SDRAM (synchronous dynamic random access memory).

BACKGROUND OF THE INVENTION

FIG. 1 shows a block diagram of an electronic system 100 having a plurality of masters sharing access to a memory device. Referring to FIG. 1, a plurality of masters including a first master 102, a second master 104, and a third master 106 share access to a multi-port memory device 108 which may be a multi-port SDRAM (synchronous dynamic random access memory). One of ordinary skill in the art is familiar with a SDRAM that operates synchronously with a clock signal from a master. In addition, a SDRAM is a command-based memory device with a master indicating a command by setting the logic states of a plurality of control signals.

The SDRAM 108 is deemed multi-port because the SDRAM 108 has a plurality of ports including a first port 112, a second port 114, and a third port 116. Each of the first, second, and third ports 112, 114, and 116 has a respective established signal interface SIF1, SIF2, or SIF3 for communication with a respective controller 122, 124, or 126 of the respective master 102, 104, or 106. Each of the signal interfaces SIF1, SIF2, and SIF3 is used for communication of control signals and data between the respective master 102, 104, or 106 and the SDRAM 108.

In the prior art, an arbitrator 118 coordinates access to the SDRAM 108 among the plurality of masters 102, 104, and 106. Each of the controllers 122, 124, and 126 sends a respective request for access signal REQ1, REQ2, or REQ3 to the arbitrator when desiring access for reading from or writing to the SDRAM 108. The arbitrator then sends a respective acknowledge signal ACK1, ACK2, or ACK3 to each of the controllers 122, 124, and 126.

Generally, one of the masters 102, 104, and 106 is granted access for reading from or writing to the SDRAM 108 at a time by the arbitrator 118. For example, one of the acknowledge signals ACK1, ACK2, and ACK3 is activated for indicating that the corresponding one of the masters 102, 104, and 106 is granted access. Such a prior art arbitration scheme of FIG. 1 disadvantageously requires respective two additional I/O (input/output) pins for the request for access and acknowledge signals at each of the masters 102, 104, and 106 and at each of the ports 112, 114, and 116 of the SDRAM 108.

FIG. 2 shows an electronic system 150 having a plurality of masters 152, 154, and 156 with respective controllers 162, 164, and 166 sharing access to a SDRAM 170 with multiple ports 172, 174, and 176. Each of the masters 152, 154, and 156 has a respective interface SIF1, SIF2, or SIF3 for exchange of control signals and data with a respective port 172, 174, or 176 of the SDRAM 170.

The electronic system 150 of FIG. 2 does not require two additional pins for the request for access and acknowledge signals. Rather, software within each of the masters 152, 154, and 156 arbitrates for access to the SDRAM 170. The masters 152, 154, and 156 communicate such arbitration amongst them-selves via UART (universal asynchronous receiver/transmitter) interfaces 182 and 184.

The prior art arbitration scheme of FIG. 2 disadvantageously requires the Additional UART interfaces 182 and 184 amongst the masters 152, 154, and 156. Also, exchange of request for access and acknowledge information amongst the masters 152, 154, and 156 introduces undesired time delay for signal processing in the electronic system 150. Furthermore, as the number of masters increases, the software complexity in turn increases.

Thus, a more efficient mechanism which also does not require additional I/O pins is desired for arbitrating access to a shared memory device among a plurality of masters.

SUMMARY OF THE INVENTION

Accordingly, in a general aspect of the present invention, request for access and acknowledge signals are sent via existing pins during transmission of an indispensable command in an electronic system having a plurality of masters sharing access to a memory device.

For arbitrating access to a memory device among a plurality of masters according to a general aspect of the present invention, a master generates a series of an indispensable command that is sent to an arbitrator. The master also generates a request for access signal that is sent to the arbitrator together with one indispensable command in the series.

In an example embodiment of the present invention, the indispensable command is an auto-refresh command that is generated periodically in the series by the master.

In another aspect of the present invention, the arbitrator generates an acknowledge signal sent to the master for indicating approval or rejection for access, after receiving the request for access signal. In an example embodiment of the present invention, the arbitrator grants approval for access to only one master at a time according to a priority policy.

In a further example embodiment of the present invention, the memory device is a SDRAM (synchronous dynamic random access memory), and the request for access signal, the one indispensable command, and the acknowledge signal are synchronized to a master clock signal. Also in that case, the indispensable command is sent as a plurality of control signals from a plurality of control pins of the master.

In another embodiment of the present invention, the request for access signal is sent from a data or address pin of the master, and the acknowledge signal is received at another data or address pin of the master.

In a further embodiment of the present invention, an interface selector chooses a respective interface of the master to be coupled to a memory core of the memory device when the master has approval for access while decoupling a respective interface of any other master from the memory core.

The present invention may be practiced with the arbitrator being fabricated as part of the memory device having multiple ports with each port being coupled to a respective master. Alternatively, the present invention may also be practiced with the arbitrator being formed off-chip from the memory device having a single port. In that case, the arbitrator has multiple ports with each port being coupled to a respective master.

In this manner, existing pins of the masters and shared memory device are used for arbitration. In addition, the request for access and acknowledge signals are sent concurrently with transmission of the indispensable command for simplicity and efficiency of arbitration for access.

These and other features and advantages of the present invention will be better understood by considering the following detailed description of the invention which is presented with the attached drawings.

BRIEF DESCRIPTION OF THE DRAWING

The figures referred to herein are drawn for clarity of illustration and are not necessarily drawn to scale. Elements having the same reference number in FIGS. 1, 2, 3, 4, 5, 6, 7, and 8 refer to elements having similar structure and/or function.

DETAILED DESCRIPTION

Figure 1:
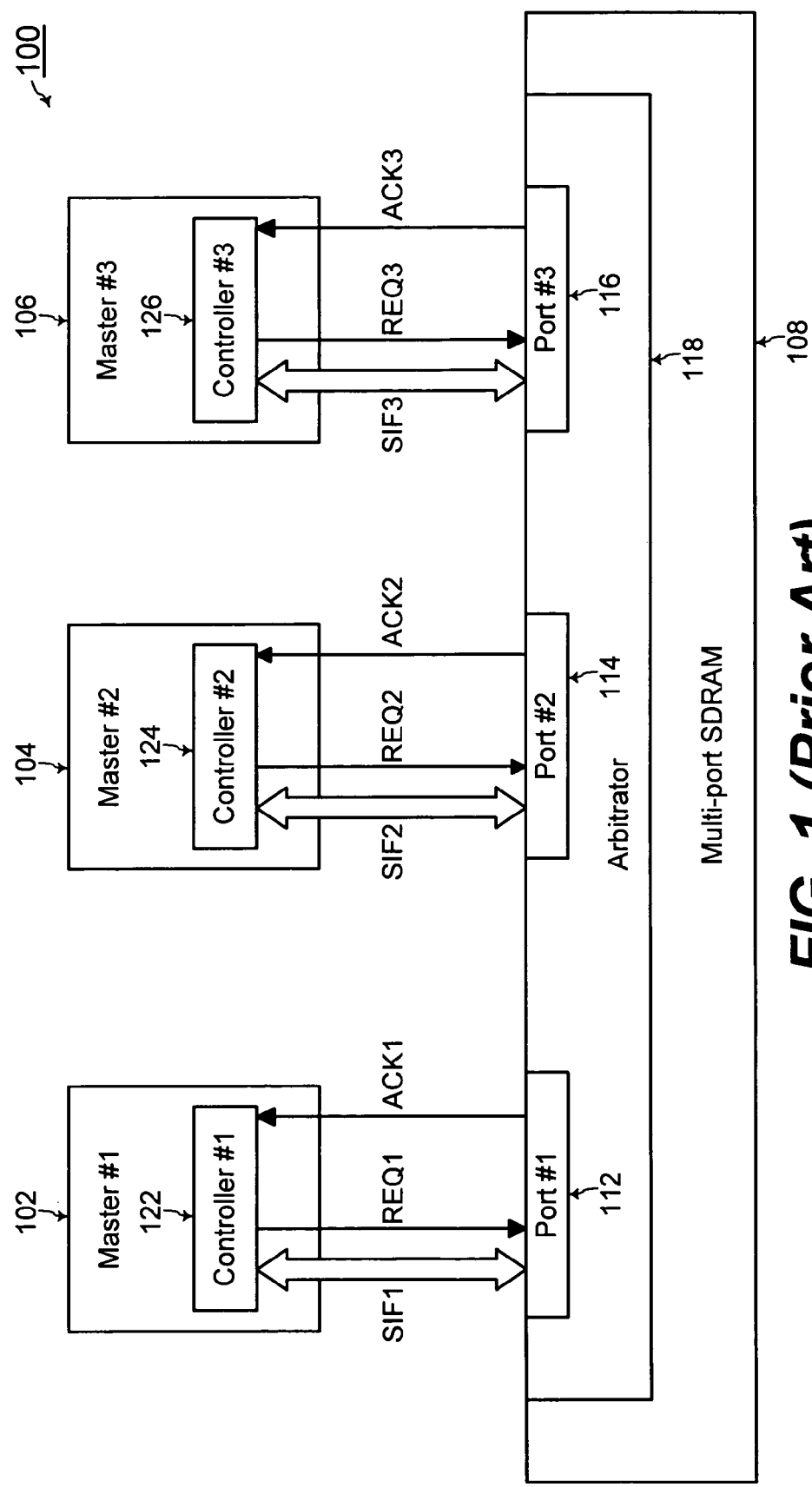
FIG. 1 shows an electronic system with a plurality of masters sharing access to a memory device with arbitration via additional pins, according to the prior art.
Figure 2:
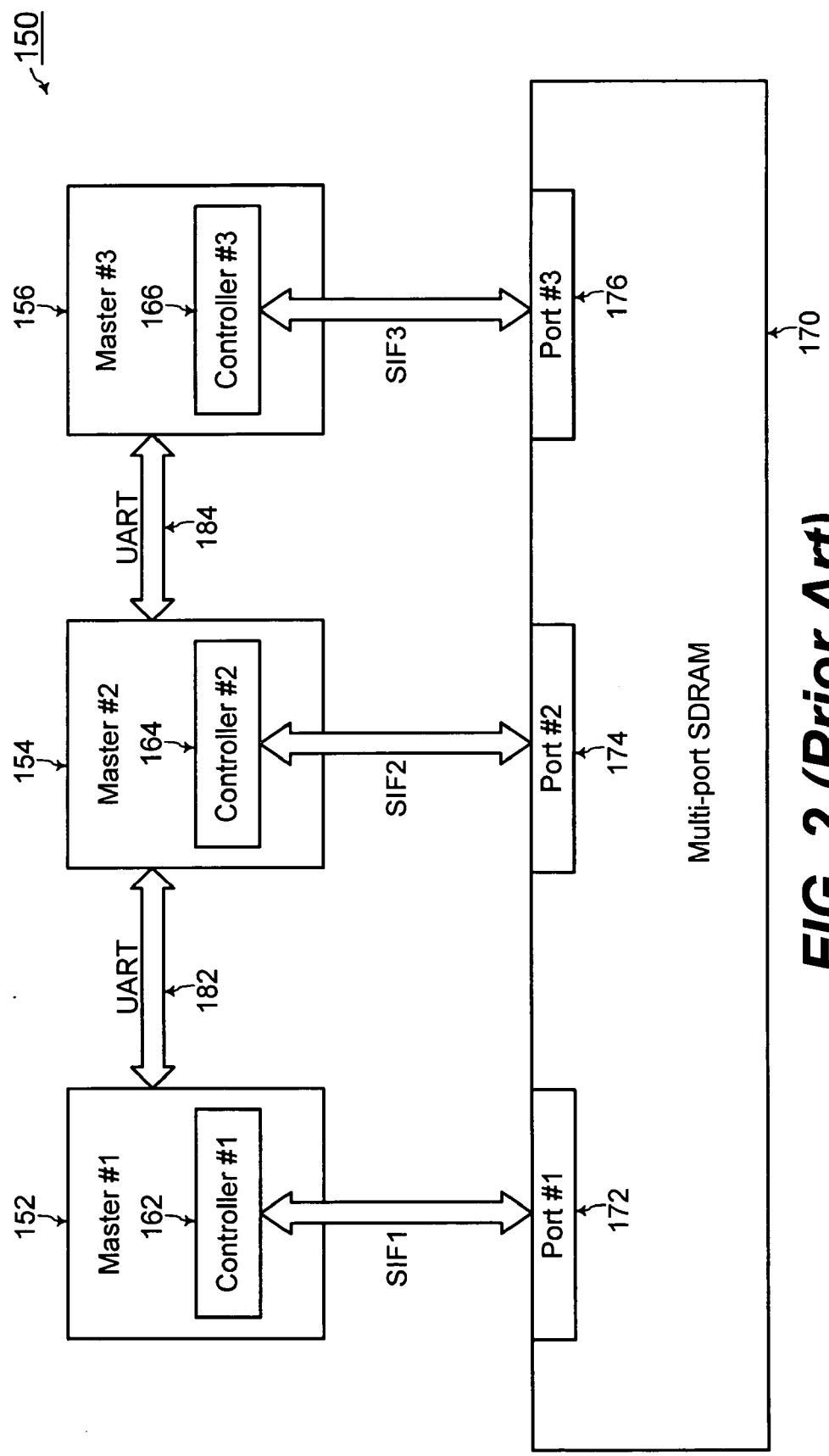
FIG. 2 shows an electronic system with a plurality of masters sharing access to a memory device with software arbitration amongst the masters, according to the prior art.
Figure 3:
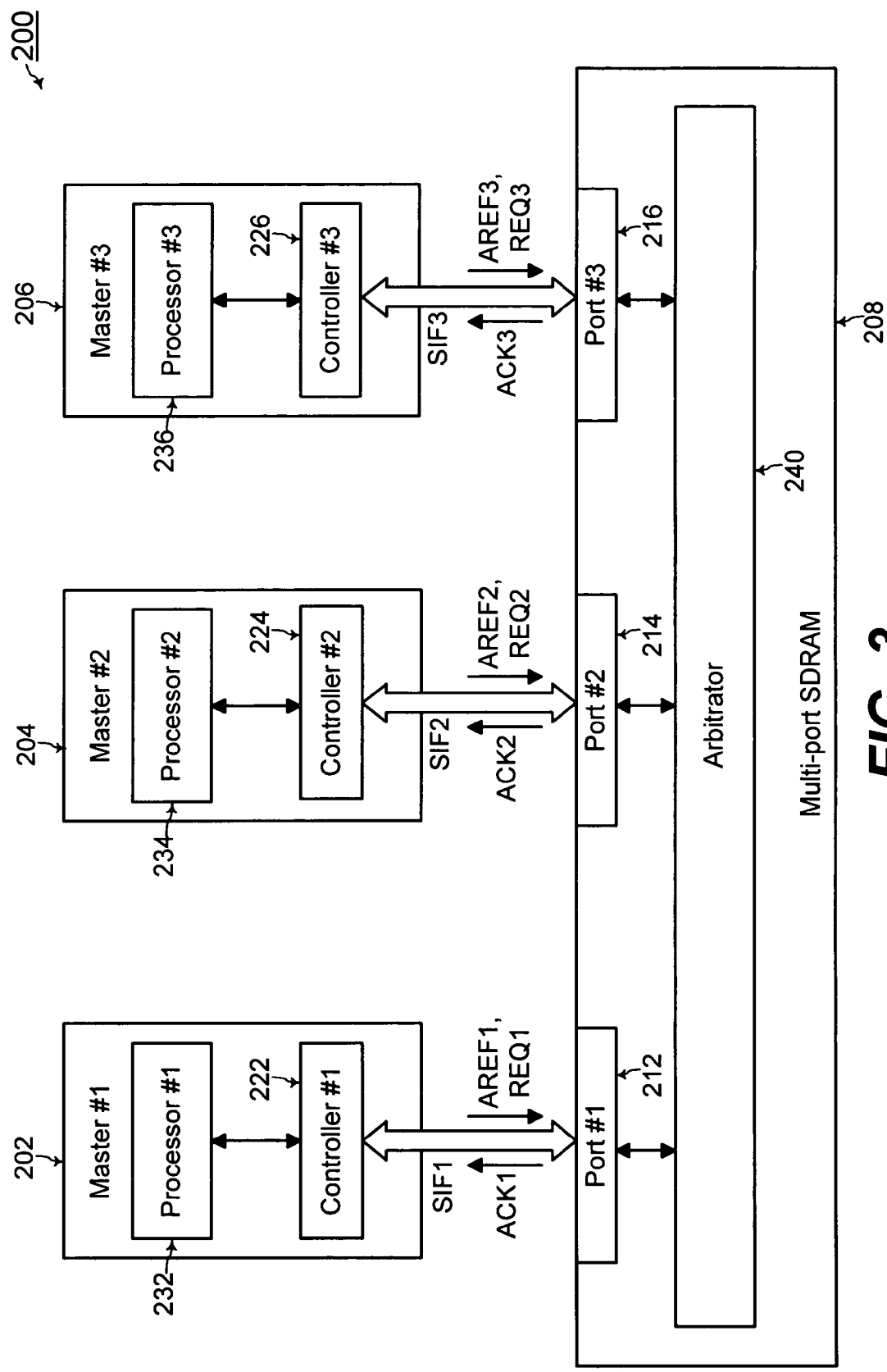
FIG. 3 shows an electronic system with an arbitration scheme via an indispensable command, according to an embodiment of the present invention.

FIG. 3 shows a block diagram of an electronic system 200 having a plurality of masters sharing access to a memory device with an arbitration scheme according to an embodiment of the present invention. Referring to FIG. 3, a plurality of masters including a first master 202, a second master 204, and a third master 206 share access to a multi-port memory device 208 which may be a multi-port SDRAM (synchronous dynamic random access memory).

One of ordinary skill in the art of memory devices is generally familiar with a SDRAM that operates synchronously with a clock signal from a master. In addition, a SDRAM in general is a command-based memory device with a master indicating a command by setting the logic states of a plurality of control signals.

The SDRAM 208 is deemed multi-port because the SDRAM 208 has a plurality of ports including a first port 212, a second port 214, and a third port 216. Each of the first, second, and third ports 212, 214, and 216 has a respective established signal interface SIF1, SIF2, or SIF3 for communication with a respective controller 222, 224, or 226 of the respective master 202, 204, or 206. Each of the signal interfaces SIF1, SIF2, and SIF3 is used for communication of control signals and data between the respective master 202, 204, or 206 and the SDRAM 208.

Each of the masters 202, 204, and 206 has a respective data processor 232, 234, or 236 that communicates with the respective controller 222, 224, or 226 when requesting for access to the shared SDRAM 208. In an aspect of the present invention, such a request for access is sent via the established interfaces SIF1, SIF2, and SIF3 along with a periodically generated indispensable command such as the auto-refresh command for the SDRAM 208.

Thus, the first controller 222 of the first master 202 sends any request for access signal REQ1 along with an auto-refresh command AREF1 via the first signal interface SIF1. Similarly, the second controller 224 of the second master 204 sends any request for access signal REQ2 along with an auto-refresh command AREF2 via the second signal interface SIF2. Additionally, the third controller 226 of the third master 206 sends any request for access signal REQ3 along with an auto-refresh command AREF3 via the third signal interface SIF3.

An arbitrator 240 within the SDRAM 208 receives such request for access signals REQ1, REQ2, and REQ3 and sends back respective acknowledge signals ACK1, ACK2, and ACK3 for indicating approval or rejection for access to the SDRAM 208. In one embodiment of the present invention, the arbitrator 240 grants approval for access to one of the masters 202, 204, and 206 at a time.

Figure 4:
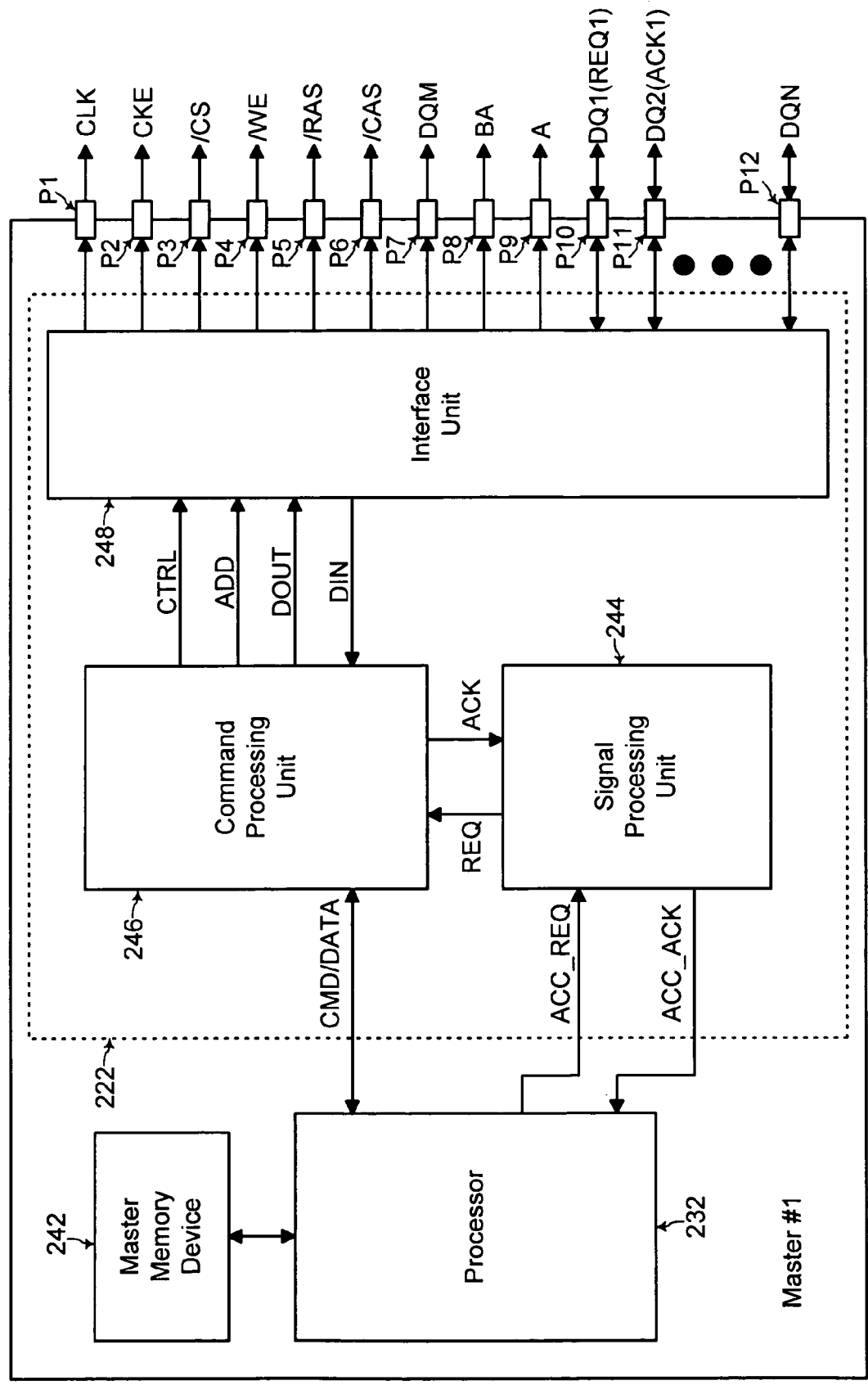
FIG. 4 shows a block diagram of components of an example master of FIG. 3, according to an embodiment of the present invention.

Each of the data processors 232, 234, and 236 is coupled to a respective master memory device (not shown in FIG. 3) having sequences of instructions stored thereon, and execution of the sequences of instructions by the data processor causes the data processor to perform the operational steps described herein. FIG. 4 shows a block diagram of an example master such as the first master 202 having such a master memory device 242, the data processor 232, and the controller 222. The other masters 204 and 206 are each implemented similarly as illustrated in FIG. 4.

Referring to FIG. 4, when the master 202 desires access to the shared SDRAM 208, the data processor 232 activates an access request signal ACC_REQ to the controller 222. The controller 222 includes a signal processing unit 244 that activates a REQ signal upon receiving the ACC_REQ signal that is activated. A command processing unit 246 within the controller 222 receives the activated REQ signal from the signal processing unit 244.

The command processing unit 246 control s an interface unit 248 within the controller 222. The command processing unit also receives a command with any associated data from the data processor 232 and in response generates a control signal CTRL, an address signal ADD, and a data signal DOUT that are transmitted to the interface unit 248. The command processing unit 246 also adjusts the CTRL, ADD, and/or DOUT signals in response to the REQ signal from the signal processing unit 244.

The interface unit 248 generates a master clock signal CLK and a plurality of control signals CKE (clock enable signal), /CS (chip select signal), /WE (write enable signal), /RAS (row address strobe signal), /CAS (column address strobe signal), and DQM (output enable signal), in response to the CTRL signal from the command processing unit 246. The CLK signal is generated onto a pin P1 of the master 202, and the CKE, /CS, /WE, /RAS, /CAS, and DQM control signals are generated onto a respective one of control pins P2, P3, P4, P5, P6, and P7 of the master 202.

Such control signals CKE, /CS, /WE, /RAS, /CAS, and DQM in general and individually are common and are known to one of ordinary skill in the art of SDRAM design. The logic state of such control signals is set by a master to indicate a particular command to a SDRAM that operates synchronously with the CLK signal from the master.

In addition, the interface unit 248 generates address signals BA (bank address) and A (row and column address) in response to the ADD signal from the command processing unit 246. The BA and A signals are generated onto a respective one of address pins P8 and P9 of the master 202. The master 202 also includes N data pins P10, P11, ... through P12 for N data signals DQ1, DQ2, ... through DQN, respectively, generated by the interface unit 248 in response to the DOUT signal from the command processing unit 246. The N data pins P10, P11, ... through P12 are each a bidirectional I/O (input/output) pin that may send or receive a signal to or from the SDRAM 208.

Figure 5:
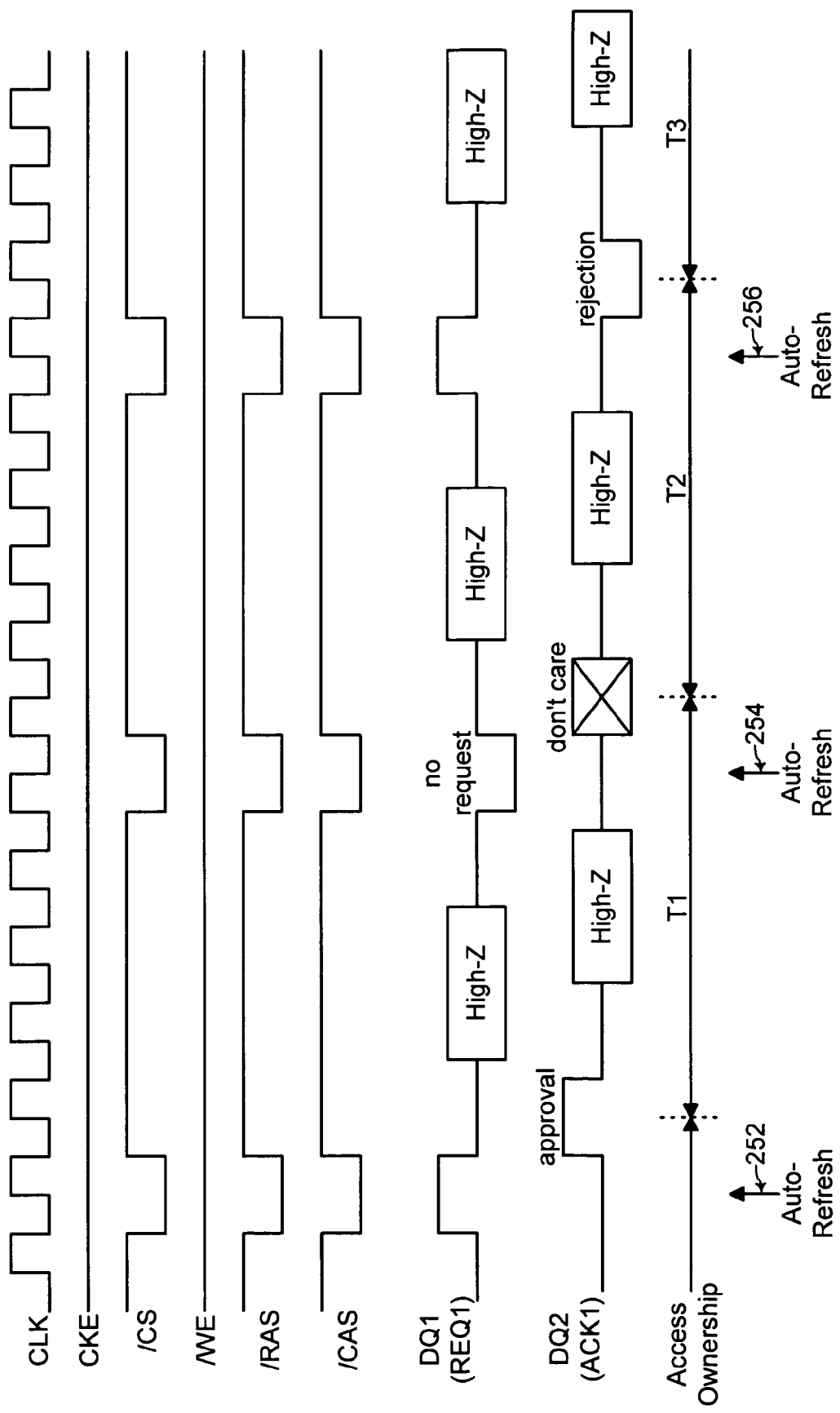
FIG. 5 shows a timing diagram of signals during operation of the master of FIG. 4, according to an embodiment of the present invention.

Operation of the example master 202 for requesting access to the SDRAM 208 is now described in reference to the timing diagram of FIG. 5. The other masters 204 and 206 also operate similarly when requesting access to the SDRAM 208. Referring to FIGS. 4 and 5, the master 202 operates according to the clock signal CLK and periodically generates a series of an auto-refresh command synchronized to the CLK signal.

The data processor 232 of the master 202 activates the ACC_REQ signal to indicate to the signal processing unit 244 that the master 202 desires access to the SDRAM 208. The signal processing unit 244 then activates the REQ signal to indicate to the command processing unit 246 that the master 202 desires access to the SDRAM 208.

The command processing unit 246 control s the interface unit 248 to periodically generate the series of the auto-refresh command by setting the appropriate logic states of the control signals CKE, /CS, /WE, /RAS, and /CAS. For example, the auto-refresh command is indicated to the SDRAM 208 when the CKE signal is set to the logic high ("1") state, the /CS signal is set to the logic low ("0") state, the /WE signal is set to the logic high state, the /RAS signal is set to the logic low state, and the /CAS signal is set to the logic low state.

Upon receiving such an auto-refresh command from a master being granted access, the SDRAM 208 may perform an auto-refresh operation (as shown by the arrowed-line time points in FIG. 5). The auto-refresh operation individually and in general is known to one of ordinary skill in the art of SDRAM.

In an aspect of the present invention, the command processing unit 246 controls the interface unit 248 to activate a request for access signal REQ1 during generation of such an auto-refresh command upon receiving the REQ signal that is activated from the signal processing unit 244. Because data is not generated on the data pins P10, P11, ..., through P12 during generation of the auto-refresh command, the interface unit sends the request for access signal REQ1 to the SDRAM 208 via the DQ1 data pin P10.

If the REQ signal is not activated indicating that the master 202 does not desire access to the SDRAM 208, the request for access signal REQ1 is deactivated during generation of the auto-refresh command. FIG. 5 shows an example for periodic generation of a series of three auto-refresh commands 252, 254, and 256. The interface unit 248 of the master 202 continually generates such a series of periodic auto-refresh commands synchronized to the CLK signal, but three auto-refresh commands 252, 254, and 256 are illustrated in FIG. 5.

In FIG. 5, the REQ1 signal is activated during the first auto-refresh command 252 and the third auto-refresh command 256, but is deactivated during the second auto-refresh command. Thus, the REQ1 signal is also synchronized to the CLK signal. The arbitrator 240 of the SDRAM 208 receives the request for access signal REQ1 and decides whether to grant approval or rejection for access to the SDRAM 208.

The arbitrator 240 generates an acknowledge signal ACK1 that is sent back to the interface unit 248 of the master 202 via another DQ2 data pin P11. The ACK1 signal is activated for indicating approval and is deactivated for indicating rejection. The arbitrator 240 also receives the CLK signal and generates the ACK1 signal synchronized to the CLK signal.

In the example of FIG. 5, the ACK1 signal is activated shortly after the REQ1 signal is activated for the first auto-refresh command 252 for indicating approval for access. On the other hand, the ACK1 signal is deactivated shortly after the REQ1 signal is activated for the third auto-refresh command 256 for indicating rejection for access. The logic state of the ACK1 signal is in a don't care state after the second auto-refresh command 254 since the REQ1 signal indicated no request for access. The DQ1 data pin P10 and the DQ2 data pin P11 have high-impedance outputs (as illustrated with "high-Z" in FIG. 5) in between the auto-refresh commands.

Referring to FIGS. 3, 4, and 5, the other masters 204 and 206 operate similarly by generating a corresponding series of auto-refresh commands. In addition, the other masters 204 and 206 similarly generate corresponding request for access signals REQ2 and REQ3, respectively. The arbitrator 240 responds similarly by generating corresponding acknowledge signals ACK2 and ACK3 for the masters 204 and 206, respectively.

The arbitrator 240 receives all of the request for access signals REQ1, REQ2, and REQ3 and selects one of the masters 202, 204, and 206 to have access to the SDRAM 208 at a time. Such selection is indicated by the arbitrator 240 to the masters 202, 204, and 206 via the respective acknowledge signals ACK1, ACK2, and ACK3.

Figure 6:
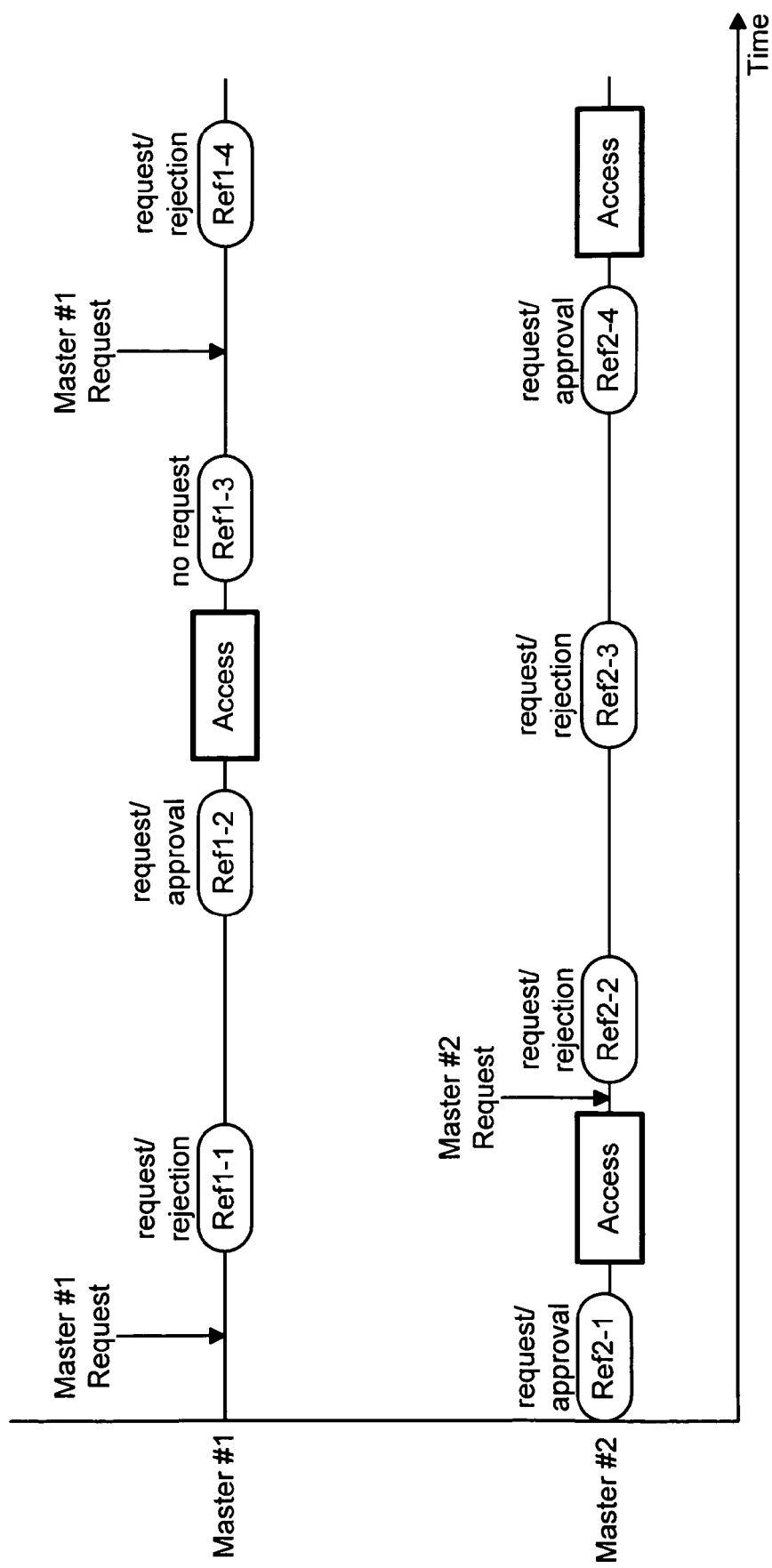
FIG. 6 shows a timing diagram of signals from a plurality of masters during arbitration for access to a shared memory device in FIG. 3, according to an embodiment of the present invention.

FIG. 6 is a timing diagram showing an example of arbitration for access between the first and second masters 202 and 204. Referring to FIG. 6, during a first auto-refresh command Ref2-1, the second master 204 is granted approval for access. Thus, when the first master 202 requests access during a subsequent first auto-refresh command Ref1-1, the first master 202 receives a rejection from access.

However, the first master 202 maintains the request for access during its second auto-refresh command Ref1-2 and is granted approval when the second master 204 no longer has access. The second master 204 requests access during its second and third auto-refresh commands Ref2-2 and Ref2-3 but receives rejections because the first master 202 already has access. The second master 204 maintains the request for access during its fourth auto-refresh command Ref2-4 and is granted approval when the first master 202 no longer has access.

The first master 202 does not make any request for access during its third auto-refresh command Ref1-3. The first master 204 makes a request for access during its fourth auto-refresh command Ref1-4 but receives a rejection from access because the second master 204 already has access.

The arbitrator 240 decides which one of the master 202, 204, and 206 has access at a time according to a priority policy. FIG. 6 illustrates a rotating priority policy as an example embodiment. However, the present invention may be practiced with other types of priority policies such as a fixed priority policy or a round-robin priority policy.

Figure 7:
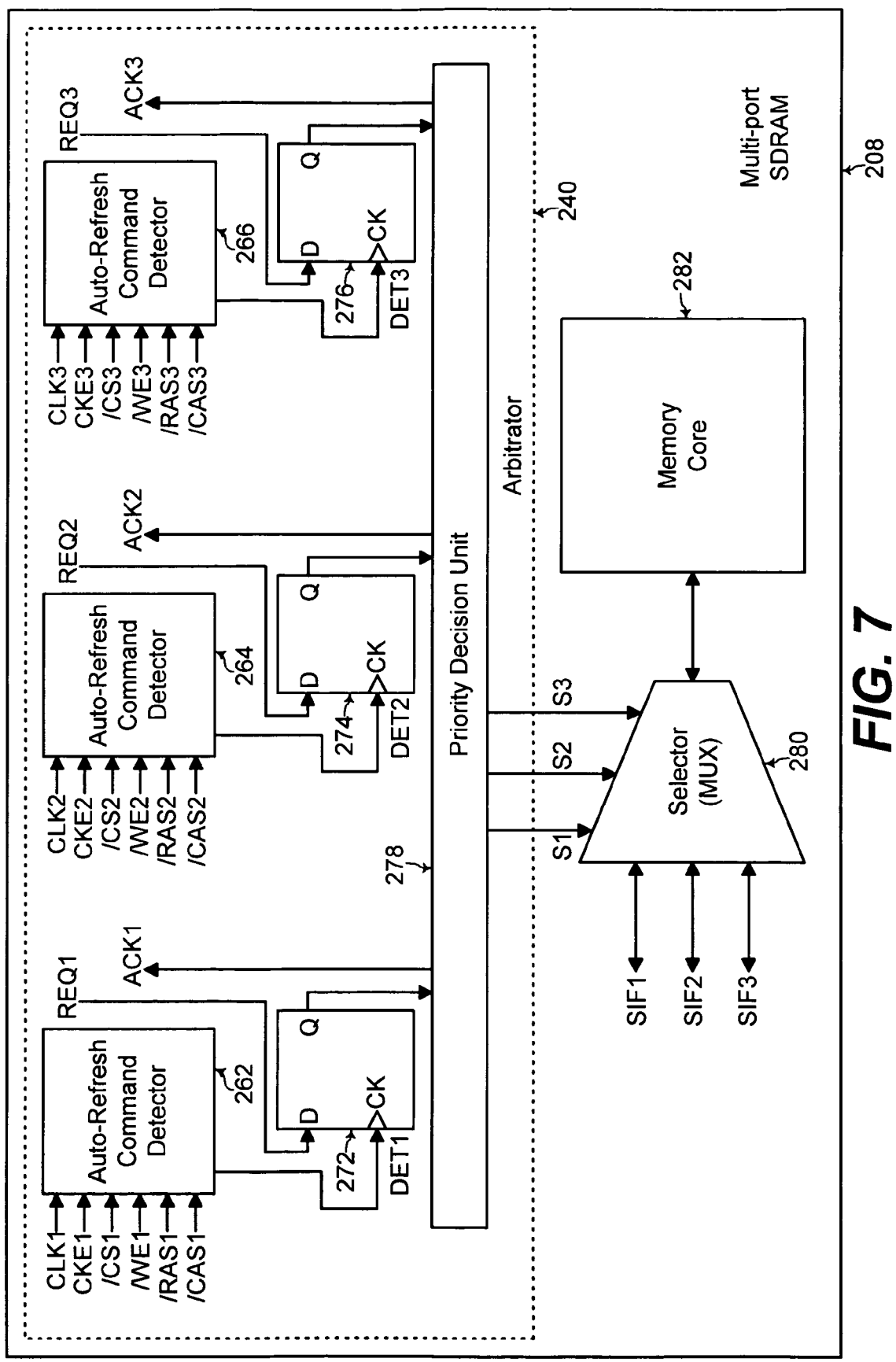
FIG. 7 shows a block diagram of components including an arbitrator and an interface selector within the shared memory device in FIG. 3, according to an embodiment of the present invention.

FIG. 7 shows a block diagram of the SDRAM 208 according to an embodiment of the present invention. The arbitrator 240 includes a first auto-refresh command detector 262 coupled to a first latch 272, a second auto-refresh command detector 264 coupled to a second latch 274, and a third auto-refresh command detector 266 coupled to a third latch 276. The outputs of the latches 272, 274, and 276 are coupled to a priority decision unit 278.

The first auto-refresh command detector 262 receives the clock signal CLK1 and the control signals CKE1, /CS1, /WE1, /RAS1, and /CAS1 from the first master 202. The first auto-refresh command detector 262 activates a first command detection signal DET1 upon detection of an auto-refresh command from such control signals. The first latch 272 latches the first request for access signal REQ1 from the first master 202 upon activation of the first command detection signal DET1.

Similarly, the second auto-refresh command detector 264 receives the clock signal CLK2 and the control signals CKE2, /CS2, /WE2, /RAS2, and /CAS2 from the second master 204. The second auto-refresh command detector 264 activates a second command detection signal DET2 upon detection of an auto-refresh command from such control signals. The second latch 274 latches the second request for access signal REQ2 from the second master 204 upon activation of the second command detection signal DET2.

Also, the third auto-refresh command detector 266 receives the clock signal CLK3 and the control signals CKE3, /CS3, /WE3, /RAS3, and /CAS3 from the third master 206. The third auto-refresh command detector 266 activates a third command detection signal DET3 upon detection of an auto-refresh command from such control signals. The third latch 276 latches the third request for access signal REQ3 from the third master 206 upon activation of the third command detection signal DET3.

Such latched request for access signals REQ1, REQ2, and REQ3 are transmitted to the priority decision unit 278. The priority decision unit 278 decides which one of the masters 202, 204, and 206 has access from such request for access signals REQ1, REQ2, and REQ3 according to a priority policy. The priority decision unit 278 generates the acknowledge signals ACK1, ACK2, and ACK3 to be transmitted to the memory devices 202, 204, and 206, respectively, depending on which memory device is granted approval for access.

In addition, the priority decision unit 278 generates control s signals S1, S2, and S3 for control ling an interface selector 280. The selector 280 is a multiplexer that selects one of the interfaces, SIF1 of the first memory device 202, SIF2 of the second memory device 204, and SIF3 of the third memory device, to be coupled to a memory core 282 of the SDRAM 208.

If the first memory device 202 is granted access, the control signals S1, S2, and S3 indicate that the first interface SIF1 is to be selected by the selector 280 for being coupled to the memory core 282. If the second memory device 204 is granted access, the control signals S1, S2, and S3 indicate that the second interface SIF2 is to be selected by the selector 280 for being coupled to the memory core 282. If the third memory device 206 is granted access, the control signals S1, S2, and S3 indicate that the third interface SIF3 is to be selected for being coupled to the memory core 282. Therefore, the SDRAM 208 operates according to any command issued from one of the memory devices 202, 204, and 206 being granted with access to the SDRAM 208.

Figure 8:
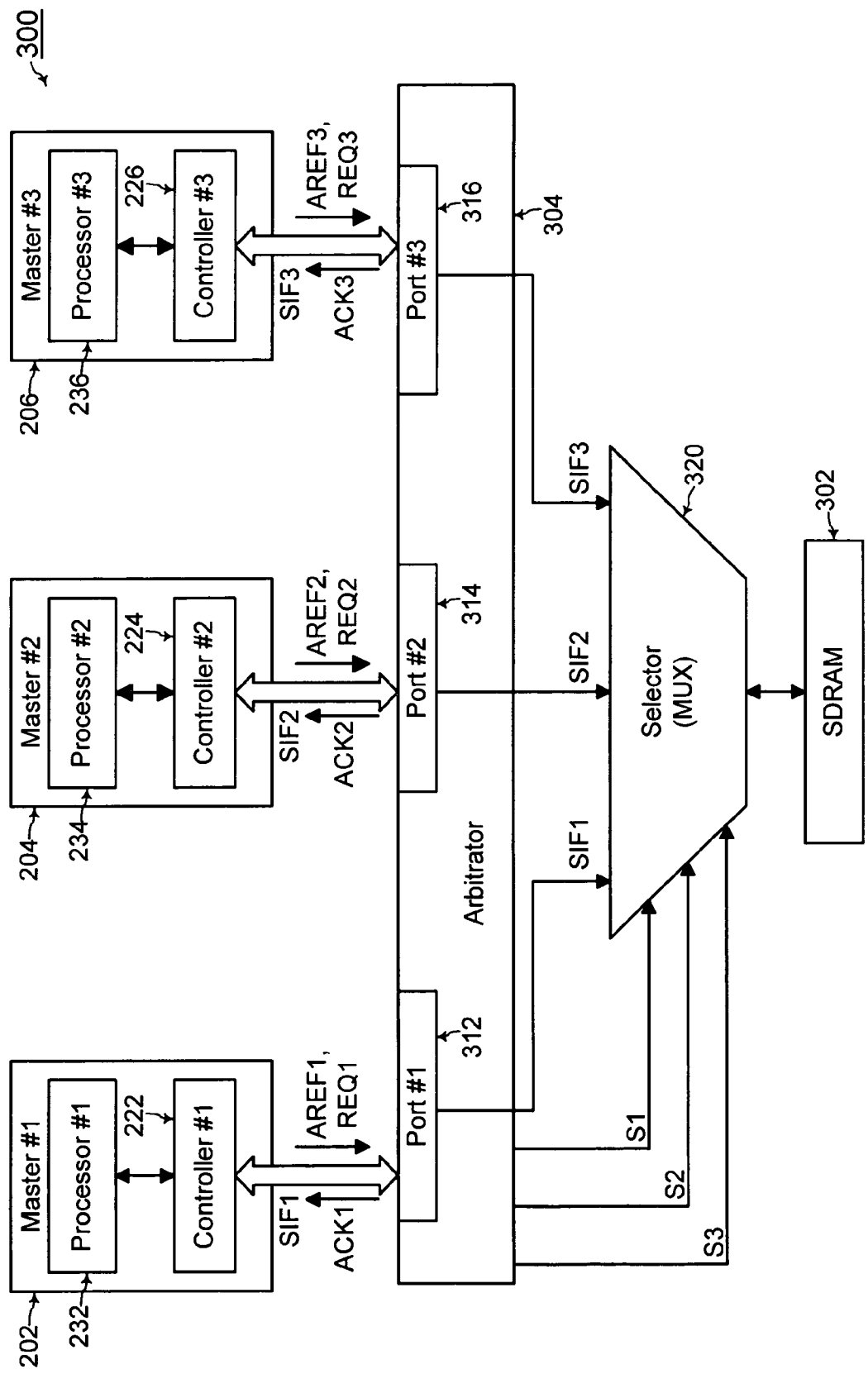
FIG. 8 shows a block diagram of an electronic system having an arbitrator and an interface selector fabricated off-chip from a shared memory device, according to another embodiment of the present invention.

FIG. 8 illustrates an electronic system 300 having the plurality of masters 202, 204, and 206 needing arbitration for access to a single port SDRAM device 302. The electronic system 300 includes an arbitrator 304 having a plurality of ports including a first port 312, a second port 314, and a third port 316. The first, second, and third ports 312, 314, and 316 have respective established interfaces SIF1, SF2, and SF3 with the first, second, and third memory devices 202, 204, and 206, respectively.

The electronic system 300 also includes an interface selector 320 for coupling one of the interfaces SIF1, SIF2, and SIF3 to the shared SDRAM 302 depending on the control signals S1, S2, and S3 from the arbitrator 304. The components of FIG. 8 operate similarly to the same named components of FIGS. 3 and 7 as described herein. However, note that the arbitrator 304 and the selector 320 in FIG. 8 are fabricated off-chip from the SDRAM 302 that may be a conventional one-port SDRAM. Thus, the multiple ports 312, 314, and 316 are formed as part of the arbitrator 304 instead of the SDRAM 302 in FIG. 8.

In this manner, in the embodiments of the present invention, pins of the established interfaces SIF1, SIF2, and SIF3 are used for transmitting the request for access and acknowledge signals. Thus, additional pins are not required for arbitrating access to the shared SDRAM. Furthermore, such signals are exchanged together with transmission of the periodic series of the auto-refresh command such that arbitration for access does not incur added time delay.

The foregoing is by way of example only and is not intended to be limiting. Thus, any number of elements as illustrated and described herein is by way of example only. In addition, the present invention has been described for the shared SDRAM. However, the present invention may also be practiced for other types of shared memory devices.

Furthermore, the present invention has been described with the request for access and acknowledge signals being exchanged together with transmission of the periodic series of the auto-refresh command. However, the present invention may also be practiced with any other command that is indispensable such that the command is generated in series from each of the masters. The present invention may be practiced when such a series of the indispensable command is generated periodically or non-periodically in time.

Additionally, the present invention may also be practiced with the request for access and acknowledge signals being transmitted via other pins, aside from the example DQ1 and DQ2 data pins P10 and P11, that are not used for transmission of the indispensable auto-refresh command. For example referring to FIG. 4, if the BA and A address pins P8 and P9 are not used for transmission of the indispensable command, such pins may be used for transmission of the request for access and acknowledge signals if such pins P8 and P9 are implemented as bi-directional pins.

The present invention is limited only as defined in the following claims and equivalents thereof.

The invention claimed is:

1. A master that arbitrates for access to a shared memory device, the master comprising:
   a data processor; and
   a master memory device having sequences of instructions stored thereon, wherein execution of the sequences of instructions by the data processor causes the data processor to perform the steps of:
   controlling generation of a series of an indispensable command that is sent to an arbitrator, wherein any activation with a transition of a logical state of a request for access signal is synchronized to a respective generation of the indispensable command such that said activation of the request for access signal is latched within the arbitrator with a respective detection of said respective generated indispensable command;

controlling generation of the request for access signal that is sent to the arbitrator together with one indispensable command in the series; and controlling generation of another request for access signal that is sent to the arbitrator together with a subsequent one of the indispensable command in the series when said request that was previously generated is rejected such that a respective approval or rejection for each request for access signal is synchronized to the series of indispensable commands.

2. The master of claim 1, wherein the indispensable command is an auto-refresh command that is generated periodically in the series.

3. The master of claim 1, wherein the master receives an acknowledge signal generated from the arbitrator for indicating the respective approval or rejection for access.

4. The master of claim 3, wherein the request for access signal, the one indispensable command, and the acknowledge signal are synchronized to a master clock signal.

5. The master of claim 3, further comprising:
a plurality of control pins for transmitting a plurality of control signals that are set for indicating the indispensable command;
a data or address pin for transmitting the request for access signal; and
another data or address pin for receiving the acknowledge signal.

6. The master of claim 1, wherein the shared memory device is a SDRAM (synchronous dynamic random access memory).

7. The master of claim 1, further comprising:
an interface that is coupled to a memory core of the shared memory device when the master has approval for access.

8. A system for arbitrating access to a memory device among a plurality of masters, comprising:
an arbitrator; and
a master that regularly generates a series of an indispensable command that is sent to the arbitrator, and wherein the master generates a request for access signal that is sent to the arbitrator together with one indispensable command in the series,
and wherein any activation with a transition of a logical state of the request for access signal is synchronized to a respective generation of the indispensable command such that said activation of the request for access signal is latched within the arbitrator with a respective detection of said respective generated indispensable command,
and wherein the master generates another request for access signal that is sent to the arbitrator together with a subsequent one of the indispensable command in the series when said request that was previously generated is rejected such that a respective approval or rejection for each request for access signal is synchronized to the series of indispensable commands.

9. The system of claim 8, wherein the indispensable command is an auto-refresh command that is generated periodically in series by the master.

10. The system of claim 8, wherein the arbitrator generates an acknowledge signal sent to the master for indicating the respective approval or rejection for access, after receiving the request for access signal.

11. The system of claim 10, wherein the arbitrator includes:
a respective command detector coupled to the master for generating a respective command detection signal;
a respective latch for latching the request for access signal when-ever the respective command detection signal is activated; and
a priority decision unit for deciding whether to grant approval for access depending on the request for access signal as latched by the respective latch and depending on a priority policy.

12. The system of claim 10, wherein the master generates a master clock signal, and wherein the request for access signal, the one indispensable command, and the acknowledge signal are synchronized to the master clock signal.

13. The system of claim 10, further comprising:
a plurality of control pins of the master for transmitting a plurality of control signals that comprise the indispensable command;
a data or address pin of the master for transmitting the request for access signal; and
another data or address pin of the master for receiving the acknowledge signal.

14. The system of claim 8, wherein the memory device is a SDRAM (synchronous dynamic random access memory).

15. The system of claim 8, further comprising:
a selector for selecting a respective interface of the master to be coupled to a memory core of the memory device when the master has approval for access while decoupling a respective interface of any other master from the memory core.

16. The system of claim 8, wherein the arbitrator is fabricated as part of the memory device having multiple ports with each port being coupled to a respective master.

17. The system of claim 8, wherein the arbitrator is formed off-chip from the memory device having a single port, and wherein the arbitrator has multiple ports with each port being coupled to a respective master.

18. A method of arbitrating access to a memory device among a plurality of masters, comprising:
generating, by a master, a series of an indispensable command that is sent to an arbitrator;
generating, by the master, a request for access signal that is sent to the arbitrator together with one indispensable command in the series,
wherein any activation with a transition of a logical state of the request for access signal is synchronized to a respective generation of the indispensable command such that said activation of the request for access signal is latched within the arbitrator with a respective detection of said respective generated indispensable command; and
generating, by the master, another request for access signal that is sent to the arbitrator together with a subsequent one of the indispensable command in the series when said request that was previously generated is rejected such that a respective approval or rejection for each request for access signal is synchronized to the series of indispensable commands.

19. The method of claim 18, wherein the indispensable command is an auto-refresh command that is generated periodically in the series by the master.

20. The method of claim 18, further comprising:
generating by the arbitrator an acknowledge signal sent to the master for indicating the respective approval or rejection for access, after receiving the request for access signal.

21. The method of claim 20, wherein the arbitrator grants approval for access to only one master at a time according to a priority policy.

22. The method of claim 20, wherein the request for access signal, the one indispensable command, and the acknowledge signal are synchronized to a master clock signal.

23. The method of claim 20, wherein the indispensable command is sent as a plurality of control signals from a plurality of control pins of the master, and wherein the request for access signal is sent from a data or address pin of the master, and wherein the acknowledge signal is received at another data or address pin of the master.

24. The method of claim 18, wherein the memory device is a SDRAM (synchronous dynamic random access memory).

25. The method of claim 18, wherein the indispensable command is sent as a plurality of control signals from a plurality of control pins of the master, and wherein the request for access signal is sent from a data or address pin of the master.

26. The method of claim 18, further comprising:
selecting a respective interface of the master to be coupled to a memory core of the memory device when the master has approval for access while decoupling a respective interface of any other master from the memory core.

* * * * *